(12) United States Patent
Manicone et al.

(10) Patent No.: US 7,439,810 B2
(45) Date of Patent: Oct. 21, 2008

(54) FAST BIAS FOR POWER AMPLIFIER GATING IN A TDMA APPLICATION

(75) Inventors: Anthony Manicone, Rochester, NY (US); Matthew Harris, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 86 days.

(21) Appl. No.: 11/449,313

(22) Filed: Jun. 8, 2006

(65) Prior Publication Data

US 2007/0285172 A1     Dec. 13, 2007

(51) Int. Cl.
*H03F 3/04* (2006.01)

(52) U.S. Cl. .................................... 330/296
(58) Field of Classification Search ............... 330/296, 330/285

See application file for complete search history.

(56) References Cited

U.S. PATENT DOCUMENTS 5,334,979 A * 8/1994 Hatakeyama ............... 341/138
6,218,904 B1 * 4/2001 Panther ..................... 330/296
6,492,875 B2 * 12/2002 Luo et al. .................. 330/296
7,190,220 B2 * 3/2007 Forstner et al. ............ 330/133
7,230,492 B2 * 6/2007 Benelbar .................... 330/289

FOREIGN PATENT DOCUMENTS

JP    03211903 A  *  9/1991

* cited by examiner

*Primary Examiner*—Robert Pascal
*Assistant Examiner*—Alan Wong
(74) *Attorney, Agent, or Firm*—Darby & Darby PC; Robert J. Sacco

(57) ABSTRACT

RF amplifier bias system for TDMA application. A bias circuit (200) is coupled to an RF power amplifier (201) circuit. The bias circuit includes a charge pump/sink circuit (215) a voltage reference circuit (204) and voltage scaling circuit (208, 210, 214). The bias system provides fast response time when transitioning between various bias voltage applied to an FET RF transistor (244).

17 Claims, 1 Drawing Sheet

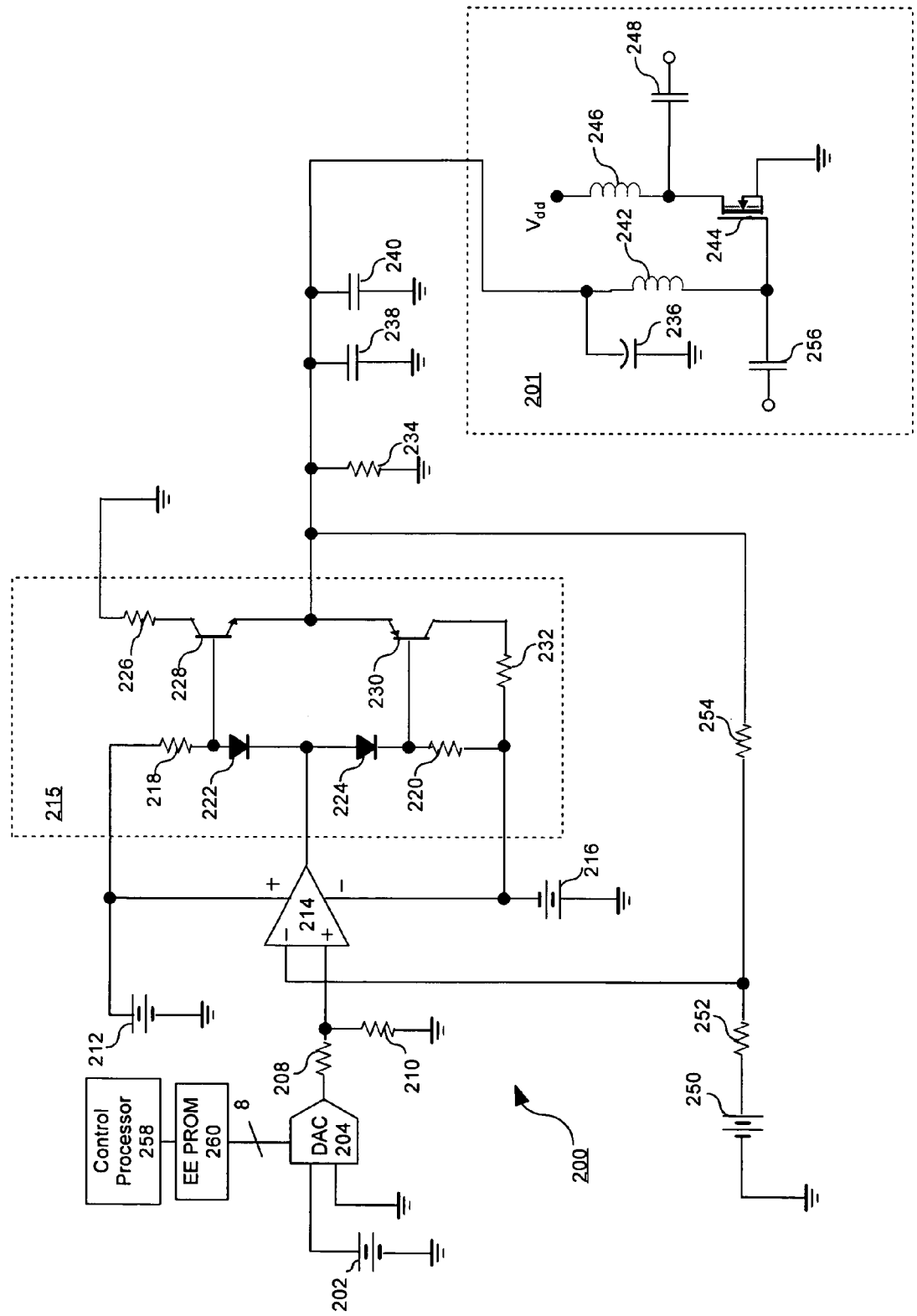

FAST BIAS FOR POWER AMPLIFIER GATING IN A TDMA APPLICATION

BACKGROUND OF THE INVENTION

1. Statement of the Technical Field

The inventive arrangements concern RF amplifiers, and more particularly, RF power amplifiers which can be rapidly cycled between a transmit and standby state.

2. Description of the Related Art

FET type RF amplifiers are well known in the art. It is also well known that an FET type RF amplifier can be turned on and off by selectively controlling the application of a bias voltage to a gate of the FET RF transistor which comprises the amplifier. Depending on its value, the gate voltage can be used to either turn the FET off, or bias the FET into its linear operating region. A simple transistor switching circuit is conventionally used to turn the bias voltage on and off. Switching the bias voltage on or off in this way will control the FET RF amplifier transistor, turning it on and off as desired. Notwithstanding the simplicity of such circuits, they can have several limitations, particularly when controlling high power RF amplifier circuits which need to satisfy stringent distortion specifications.

For example, in order to reduce intermodulation (IM) distortion, it is sometimes desirable to connect a relatively large value of capacitor to the gate of the FET RF transistor. This capacitor can, depending on the specified requirements for IM distortion, have a value on the order of 10 µF. Although such a capacitor is useful for reducing IM distortion, it also creates certain problems. For example, the large value capacitor can cause these FET type RF amplifiers to require a relatively long time to transition between a fully on state, in which amplified RF energy is being output from the amplifier, to a fully off state, when the RF energy output is substantially terminated.

Quickly transitioning an RF power amplifier between an on and an off state can be important in certain applications. For example, certain types of networking and communications systems can require a transmitter to transmit only during certain limited and well defined time periods. For example, such systems can include TDMA based systems in which different transceiver units may be assigned certain time slots for transmitting data. In such systems RF amplifiers must be able to terminate RF transmissions at predetermined times. For example, it can be necessary in some applications to transition the RF amplifier between a fully on and fully off state in less than 40 µS. Accordingly, it is desirable to avoid any substantial delay which might occur between the application of a control signal which turns the RF amplifier on or off, and the actual time when RF energy output from the FET transistor finally terminates.

Another important concern when biasing FET RF amplifier circuits is stability. It can be desirable to maintain a very stable bias voltage over a large range of temperatures. Although stable voltage references can be used to help overcome this stability issue, the problem becomes considerably more complex in those instances where there is a need for dynamic control of the bias voltage. Conventional bias circuits with variable bias output settings can have an undesirable tendency to vary the bias voltage as a function of temperature.

SUMMARY OF THE INVENTION

The invention concerns an RF amplifier system which includes an RF power amplifier transistor. For example the RF power amplifier transistor can be an FET device. A bias circuit is coupled to the RF power amplifier transistor. The bias circuit includes a charge pump/sink circuit, a voltage reference circuit and voltage scaling circuit.

The voltage reference circuit can include any suitable device for providing a predetermined or variable voltage for a transistor bias. According to one aspect of the invention, the voltage reference circuit is a digital to analog converter circuit. In that case, the output of the voltage reference circuit can be digitally controlled.

The voltage scaling circuit is an electronic means for scaling the output voltage of the voltage reference. For example, the voltage scaling circuit is advantageously implemented as an operational amplifier. An output of the voltage scaling circuit is coupled to the charge pump/sink circuit.

According to one aspect of the invention, the charge pump/sink circuit includes first and second diodes. A cathode of the first diode and an anode of the second diode are respectively connected to form the input of the charge pump/sink circuit. An anode of the first diode is coupled to a base of a first transistor, and a cathode of the second diode is coupled to a base of a second transistor. According to one aspect of the invention, the first transistor is of an NPN type and the second transistor is of PNP type. The transistors are connected in a series configuration with an emitter of the first transistor connected to an emitter of the second transistor to form an output junction of the charge pump/sink. A collector of the first transistor is connected to ground through a first resistor and a collector of the second transistor is connected to a voltage source through a second resistor. A feedback loop is also provided. The feedback loop includes a third resistor disposed between the output junction and an input of the voltage scaling device.

BRIEF DESCRIPTION OF THE DRAWINGS

The single drawing FIGURE shows in schematic form a bias control circuit for an FET type RF amplifier that is useful for understanding the invention.

DETAILED DESCRIPTION OF THE PREFERRED EMBODIMENTS

A dynamically variable biasing circuit for an FET RF amplifier is shown in the drawing FIGURE. The bias circuit 200 provides a bias voltage that has several advantages over conventional bias circuits. In particular, bias circuit 200 is (1) dynamically variable, (2) highly stable over a wide range of temperatures, and (3) offers very fast transitions between the bias voltages associated with RF transistor on states and off states, even where relatively large value capacitors are used at the input gate of the RF transistor for the purpose of reducing intermodulation distortion.

It can be observed that the bias circuit 200 is connected to a conventional FET type RF amplifier circuit 201. The FET type RF amplifier circuit 201 includes FET device 244, inductors 242, 246 for preventing RF energy from coupling to bias circuit 200 or the $V_{dd}$ power supply circuit. The FET type RF amplifier circuit 201 also includes input coupling capacitor 256 and output coupling capacitor 248. Finally, FET type RF amplifier circuit 201 includes a relatively large value capacitor 236 coupled to the gate of FET device 244 through inductor 242. The capacitor 236 is an electrolytic capacitor, but the invention is not limited in this regard. Any capacitor of sufficiently large value can be used for this purpose. The actual value of this capacitor is advantageously chosen to reduce the intermodulation distortion generated at the gate of FET device 244 to as low a value as possible.

FET type RF amplifier circuit 201 is well known in the art, but generally requires a bias voltage applied to the input gate of FET device 244 as shown. In the embodiment shown, a bias voltage of −12 volts at the gate of transistor 244 will disable the RF amplifier circuit 201. Conversely, a bias voltage of between −12 volts and −5.5 volts at the gate of transistor 244 will bias transistor 244 into its active region, with −5.5 volts causing transistor 244 to be fully on and saturated. Those skilled in the art will appreciate that the exact voltages required to transition the RF amplifier circuit between an on and an off state will generally depend on a variety of factors, including the type of FET transistor 244 that is used. Accordingly, the invention is not intended to be limited to the particular bias voltages described herein.

Bias circuit 200 is provided for supplying a bias voltage to the FET RF amplifier circuit 201. The bias circuit 200 is dynamically variable, highly stable over a wide temperature range, and provides fast on/off transitions, even when large capacitor values are coupled to the gate of FET device 244 as shown.

The bias circuit 200 includes a digital to analog converter (DAC) 204. Any one of a variety of commercially available DAC devices can be used for this purpose, provided that it offers sufficiently fast conversion speeds to meet the needs of the bias on/off switching, and a suitable range of output voltages. For example, in the embodiment shown, the DAC has an output voltage range from 0 V to 3 V and a conversion speed which is less than 500 nanoseconds. The inputs to DAC 202 include a supply voltage 202 for operating the device, and a digital control interface. The digital control interface consists of an 8 bit serial data line, a clock line, and an enable line, all of which are digital input lines for applying a digital word to the input of the DAC which specifies an analog output voltage.

The analog voltage output of DAC 204 is coupled to voltage scaling resistors 208 and 210. The exact value of the scaling resistors 208, 210 will depend on the desired bias voltage output from the bias circuit 200. For example, in the embodiment shown, the scaling resistor 208 has a value of 10 kΩ and scaling resistor 210 has a value of 64.9 kΩ. However, those skilled in the art will appreciate that the invention is not limited in this regard.

The output from the scaling resistors 208, 210 is communicated to the input of operational amplifier 214 to control the output of that device. In the embodiment shown in the drawing, the output of the scaling resistors is coupled to the positive input of the operational amplifier. Those skilled in the art will appreciate that the invention is not limited in this regard, and other circuit configurations could apply the output of the scaling resistor to the negative input of the operational amplifier, depending on the desired bias voltage and polarity of the output from DAC 204.

A suitable supply voltage is also connected to the positive and negative supply pins of operational amplifier 214. In the embodiment shown, the positive supply voltage 212 is +8 volts and the negative supply voltage is selected to be −15 volts to provide a desired range of output voltage. However, those skilled in the art will appreciate that the invention is not limited in this regard. Further, it will be appreciated that operational amplifier 214 can be any one of a wide variety of commercially available operational amplifier devices. The operational amplifier 214 is advantageously selected to have a relatively fast slew rate and minimal propagation delay. More particularly, the slew rate and propagation delay are advantageously selected to minimize any delay associated with transitioning the bias circuit 200 between two or more bias voltage states. The operational amplifier 214 is also preferably selected to have a maximum output that is sufficiently large to drive a charge pump/sink 215 as hereinafter described to provide a desired bias voltage output. According to one embodiment, the operational amplifier can be selected to be an MC33172 device which is available from On Semiconductor of Phoenix, Ariz.

The output of operational amplifier 214 is coupled to an input of charge pump/sink 215. Various different charge pump/sink circuits are known in the art. Accordingly, it should be understood that the particular circuit configuration of charge/pump sink 215 disclosed in the drawing is merely provided as one possible example of a charge pump/sink that can be used in the present invention. Other charge pump/sink circuits are also possible as would be appreciated by those skilled in the art. Accordingly, the invention is not limited in this regard.

The input of charge pump/sink circuit 215 is comprised of diodes 222 and 224. These diodes are generally provided to compensate for the effect of diode junctions within transistors 228 and 230. Accordingly, the diodes 222, 224 should have a voltage drop that generally corresponds to the base-emitter or base-collector voltage drop in the transistors 228, 230. Diodes 222 and 224 are respectively coupled to the base of transistors 228, 230. Transistors 228, 230 are bipolar junction transistors. Transistor 228 is an NPN type transistor whereas transistor 230 is a PNP type. For example, SMBT 3904 transistors can be used for this purpose, and are available from a variety of commercial manufacturers. Still, those skilled in the art will appreciate that other types of transistors can also be used to form the charge pump/sink 215. Resistors 218, 220, 226 and 232 are provided to properly bias transistors 228, 230. In the embodiment shown, these resistors have values of 33.2 kΩ, 33.2 kΩ, 4.7Ω, and 4.7Ω, respectively. However, the invention is not limited to these values. Other values can also be used, depending on the particular bias voltage requirements for the FET RF amplifier. The charge pump/sink can be connected to a suitable supply voltage, such as voltage sources 212, 216 as shown in the drawing.

A feedback resistor 254 is connected from the output of the charge sink 215 to the negative input of the operational amplifier 214. Also connected to the negative input of operational amplifier 214 is resistor 252. Resistors 252 and 254 define the gain of the operational amplifier. In the embodiment shown in the drawing, resistor 252 has a value of 100 kΩ and resistor 254 has a value of 150 kΩ. However, it will be appreciated by those skilled in the art that other resistor values can also be used, depending on the particular application of the inventive arrangements.

Resistor 252 is also connected to a voltage reference source 250. The voltage reference source 250 is a stable voltage source which establishes a voltage offset for the operational amplifier 214. The actual voltage offset at the output of the device will depend on the voltage of the voltage reference source 250 and the gain as established by resistors 252, 254. For example, in the embodiment shown, the voltage reference source 250 is 8 volts. However, those skilled in the art will appreciate that the invention is not limited in this regard.

In a preferred embodiment, the voltage reference source 250 can be a temperature compensated voltage source. For example, any one of a variety of commercially available integrated circuit or discrete device circuit arrangements can be used to provide a stable, temperature compensated voltage reference for the offset voltage applied to the negative input of the operational amplifier 214. Voltage reference sources are well known in the art.

The output of the charge pump/sink 215 is connected to resistor 234 and to filtering capacitors 238, 240. Filter capacitors 238 are provided to decouple the output of the charge pump/sink 215 from the input of the FET RF transistor 244. This arrangement substantially prevents RF energy from coupling into the charge pump/sink from the RF amplifier circuit 201.

In operation, the DAC 204 provides a selectable voltage reference signal for controlling the bias voltage output. In particular DAC 204 receives a digital word input from a control system to selectively control the output of the DAC.

The digital word input is provided by EE PROM 260 which is controlled by a microprocessor 258 through a conventional interface. Microprocessor 258 is advantageously programmed with a suitable set of instructions for controlling the operation of the FET type RF amplifier 201. For example, in a time division multiple access (TDMA) application, the microprocessor 258 can be programmed to automatically selectively turn on the RF amplifier 201 during a particular time slot assigned to a device for transmission of data. Conversely, the microprocessor can be programmed to automatically selectively turn off the RF amplifier 201 during other time slots. For example, such off periods can occur when the TDMA device is intended to be receiving data, or is intended to simply remain inactive as other devices are transmitting.

The digital word input to the DAC 204 is chosen to cause DAC 204 to generate a zero volt output when it is desired to disable the FET RF amplifier 201. Conversely, the digital word input to the DAC 204 is chosen to cause DAC 204 to generate any output voltage between 0 and 3 volts, which then turns on transistor 244 and sets transistor 244 quiescent current to a predetermined value. Still, those skilled in the art will appreciate that the foregoing values are merely one possible implementation in the example shown in the drawing. The invention is not limited in this regard, and other voltage outputs from the DAC can be selected, depending on the particular application.

The output of the DAC 204 is communicated first to the scaling resistors 208, 210, and then to the positive input of the operational amplifier 214. Operational amplifier 214 applies a predetermined amount of gain to the applied voltage. The scaling resistors and the operational amplifier, with its preset gain, will together provide a scaling function to determine a bias voltage output to the RF amplifier 201.

An offset voltage from voltage reference source 250 is applied to the input of the operational amplifier to produce a desired output of the charge pump/sink 215 when the DAC output is zero volts. For example, if the input offset voltage from voltage reference source 250 is 8 volts to the negative terminal of the operational amplifier, then the operational amplifier 214 will produce an output of −12 volts when the DAC output is zero. This −12 volt signal will appear at the output of the charge pump/sink and bias the RF amplifier 201 to an off state.

Conversely, if the DAC produces a 3 volt output, the scaling resistors 208, 210 will cause a 2.54 volt input to appear at the positive input terminal of the operational amplifier 214. The resulting output voltage from the charge pump/sink 215 will be −5.5 volts. This −5.5 volts bias voltage will fully turn on the RF amplifier 201.

As previously noted, the large value capacitor 236 will have the undesired effect of greatly slowing the time that it takes for the bias voltage at the input of transistor 244 to slew between the levels needed to turn the RF amplifier 201 from an on state to an off state. Significantly, the charge pump/sink 215 has the ability to rapidly source and sink relatively large amounts of current. Accordingly, the inclusion of the charge pump/sink 215 at the interface between the operational amplifier 214 and the transistor 244 can greatly increase the rate at which the bias voltage can be changed. This ability is particularly important in those instances where the RF amplifier is used in a TDMA application and must be rapidly turned on and turned off with limited transition time.

All of the apparatus, methods and algorithms disclosed and claimed herein can be made and executed without undue experimentation in light of the present disclosure. While the invention has been described in terms of preferred embodiments, it will be apparent to those of skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those skilled in the art are deemed to be within the spirit, scope and concept of the invention as defined.

We claim:

1. An RF amplifier system, comprising:
   an RF power amplifier transistor;
   a bias circuit coupled to said RF power amplifier transistor, said bias circuit comprising a charge pump/sink circuit and a voltage reference circuit including a digital to analog converter circuit; and
   wherein said bias circuit comprises a voltage scaling circuit and said voltage scaling circuit is an operational amplifier.

2. The RF amplifier system according to claim 1, wherein an output of said voltage scaling circuit is coupled to said charge pump/sink circuit.

3. An RF amplifier system, comprising:
   an RF power amplifier transistor;
   a bias circuit coupled to said RF power amplifier transistor, and comprising a charge pump/sink circuit including first and second diodes; and
   wherein said bias circuit comprises a voltage reference circuit and a voltage scaling circuit, said voltage scaling circuit is an operational amplifier, an output of said voltage scaling circuit is coupled to said charge pump/sink circuit, and a cathode of said first diode and an anode of said second diode are respectively connected to said output of said voltage scaling circuit.

4. The RE amplifier system according to claim 3, wherein said charge pump/sink is further comprised of an first transistor of NPN type and a second transistor of PNP type, connected in a series configuration with an emitter of said first transistor connected to an emitter of said second transistor at an output junction of said charge pump/sink, and an anode of said first diode coupled to a base of said first transistor, and a cathode of said second diode coupled to a base of said second transistor.

5. The RF amplifier system according to claim 4, wherein a collector of said first transistor is connected to ground through a first resistor.

6. The RF amplifier system according to claim 5, wherein a collector of said second transistor is connected to a voltage source through a second resistor.

7. The RF amplifier system according to claim 6, further comprising a feedback loop comprising a third resistor disposed between said output junction and an input of said voltage scaling device.

8. The RF amplifier system according to claim 7, wherein said RF power amplifier transistor is an FET device.

9. An RF amplifier system, comprising:
   a FET type RF power amplifier transistor;
   a bias circuit coupled to said RF power amplifier transistor, said bias circuit comprised of a voltage reference circuit coupled to an input of a voltage scaling circuit, said voltage scaling circuit having an output coupled to a charge pump/sink circuit; and
   wherein said voltage scaling circuit is an operational amplifier and said voltage reference circuit is a digital to analog converter circuit.

10. The RF amplifier system according to claim 9, wherein said charge pump/sink circuit is comprised of first and second diodes, a cathode of said first diode and an anode of said second diode respectively connected to said output of said voltage scaling circuit.

11. The RF amplifier system according to claim 10, wherein said charge pump/sink is further comprised of a first transistor of NPN type and a second transistor of PNP type, connected in a series configuration with an emitter of said first transistor connected to an emitter of said second transistor at an output junction of said charge pump/sink, and wherein an anode of said first diode is coupled to a base of said first transistor, and a cathode of said second diode coupled to a base of said second transistor.

12. The RF amplifier system according to claim 11, wherein a collector of said first transistor is connected to ground through a first resistor.

13. The RF amplifier system according to claim 12, wherein a collector of said second transistor is connected to a voltage source through a second resistor.

14. The RF amplifier system according to claim 13 further comprising a feedback loop comprising a third resistor disposed between said output junction and an input of said voltage scaling device.

15. An RF amplifier system, comprising:
  an FET type RF power amplifier transistor;
  a bias circuit coupled to said RF power amplifier transistor, said bias circuit comprised of a digital to analog converter circuit configured for providing a voltage reference for said bias circuit, an output of said digital to analog converter circuit coupled to an input of a scaling circuit comprised of an operational amplifier, said operational amplifier having an output coupled to a charge pump/sink circuit.

16. The RF amplifier system according to claim 15 wherein said charge pump/sink circuit is comprised of first and second diodes, a cathode of said first diode and an anode of said second diode respectively connected to said output of said operational amplifier.

17. The RF amplifier system according to claim 16 wherein said charge pump/sink is further comprised of a first transistor of NPN type and a second transistor of PNP type, connected in a series configuration with an emitter of said first transistor connected to an emitter of said second transistor at an output junction of said charge pump/sink, and wherein an anode of said first diode is coupled to a base of said first transistor, and a cathode of said second diode coupled to a base of said second transistor.

* * * * *